United States Patent [19]

Hsu

[11] Patent Number: 5,320,978
[45] Date of Patent: Jun. 14, 1994

[54] SELECTIVE AREA PLATINUM FILM DEPOSITION

[75] Inventor: David S. Y. Hsu, Alexandria, Va.

[73] Assignee: The United States of America as represented by the Secretary of the Navy, Washington, D.C.

[21] Appl. No.: 99,510

[22] Filed: Jul. 30, 1993

[51] Int. Cl.$^5$ .................................... H01L 21/283
[52] U.S. Cl. .................................... 437/192; 437/187; 437/201; 437/245; 427/253
[58] Field of Search ............... 437/192, 187, 201, 245; 427/97, 99, 124, 253

[56] References Cited

U.S. PATENT DOCUMENTS

| | | | |
|---|---|---|---|
| 3,619,288 | 11/1971 | Sirtl | 437/187 |
| 3,889,359 | 6/1975 | Rand | 437/188 |
| 4,517,225 | 5/1985 | Broadbent | 427/89 |
| 4,585,515 | 4/1986 | Maa | 156/643 |
| 4,830,891 | 5/1989 | Nishitani et al. | 427/253 |
| 4,957,777 | 9/1990 | Ilderem et al. | 427/55 |
| 5,110,760 | 5/1992 | Hsu | |
| 5,130,172 | 7/1992 | Hicks et al. | 427/252 |
| 5,169,685 | 12/1992 | Woodruff et al. | |

OTHER PUBLICATIONS

M. J. Rand, "Chemical Vapor Deposition of Thin-Film Platinum", J. Electrochem. Soc'y: Solid State Sci. & Tech. 120 (5) 686-693 (May 1973).

D. S. Y. Hsu et al., "20 nm linewidth platinum pattern fabrication using conformal effusive-source molecular precursor deposition and sidewall lithography", J. Vacuum Sci. & Tech. B 10(5) 2251-2258 (Sep./Oct. 1992).

*Primary Examiner*—T. N. Quach
*Attorney, Agent, or Firm*—Thomas E. McDonnell; John J. Karasek

[57] ABSTRACT

A process for selectively depositing platinum on a conductive or semiconductive substrate has the steps of: patterning a polyimide layer on the substrate to have exposed areas and unexposed areas; and, at an operating temperature and an operating pressure, flowing a platinum precursor gas over the substrate.

11 Claims, 4 Drawing Sheets

SELECTIVE AREA PLATINUM FILM DEPOSITION

BACKGROUND OF THE INVENTION

1. Field of the Invention

This invention relates to selective area platinum film deposition on substrates, and more particularly to patterned deposition of platinum films by low pressure CVD methods.

2. Description of the Related Art

To date, processes for selective area metallization on substrates have been developed for a number of metals, including tungsten, aluminum, and copper. These three metals are widely used in the computer chip industry for microelectronic fabrication (VLSI and ULSI fabrication).

It is desired to develop processes for selective area metallization with platinum. Because of its high corrosion resistance, platinum microelectronic devices are desired in applications where great reliability is desired (e.g. medical implants) and in applications exposed to corrosive environments (e.g. chemical plants).

It is also desired to make these processes as simple as possible, and to permit the removal of the masking material without the need to protect the deposited platinum.

$SiO_2$ patterning for selective metallization is known. To use a $SiO_2$ pattern to define selected areas for metallization, it is necessary to produce a $SiO_2$ layer by thermal oxidation or some CVD process. It is then necessary remove the $SiO_2$ by a selective etching step that does not attack the metal, a complex process.

SUMMARY OF THE INVENTION

Accordingly, it is an object of this invention to selectively deposit platinum films on a variety of substrates by a simple process, to submicron linewidth consistent with VLSI and ULSI integration.

It is a further object to selectively deposit platinum films on a variety of substrates by a process that will permit the removal of the masking material without the need for protecting the deposited platinum.

These and additional objects of the invention are accomplished by the structures and processes hereinafter described. A process for selectively depositing platinum on a conductive or semiconductive substrate has the steps of selectively depositing a polyimide on the substrate, thereby patterning the substrate to have exposed areas and unexposed areas; and, at a selected temperature and pressure, flowing a platinum precursor gas over the substrate. The selected operating temperature is at least a temperature at which platinum deposition on the substrate is effected, but less than a temperature at which either the polyimide degrades or the platinum fails to selectively deposit on the substrate. The vacuum pressure after pumping down for the reaction chamber (hereinafter the base pressure) is less than the combined pressure (hereinafter the operating pressure) of the precursor gas and any carrier gas (the carrier gas is optional). The pressure of the precursor gas is less than a pressure at which platinum will fail to selectively deposit on the substrate. By carrying out this process, a platinum metal film is deposited on the exposed portions of the substrate, and not deposited on the polyimide film.

BRIEF DESCRIPTION OF THE DRAWINGS

A more complete appreciation of the invention will be readily obtained by reference to the following Description or the Preferred Embodiments and the accompanying drawings in which like numerals in different figures represent the same structures or elements, wherein.

DESCRIPTION OF THE PREFERRED EMBODIMENTS

Figure 1:
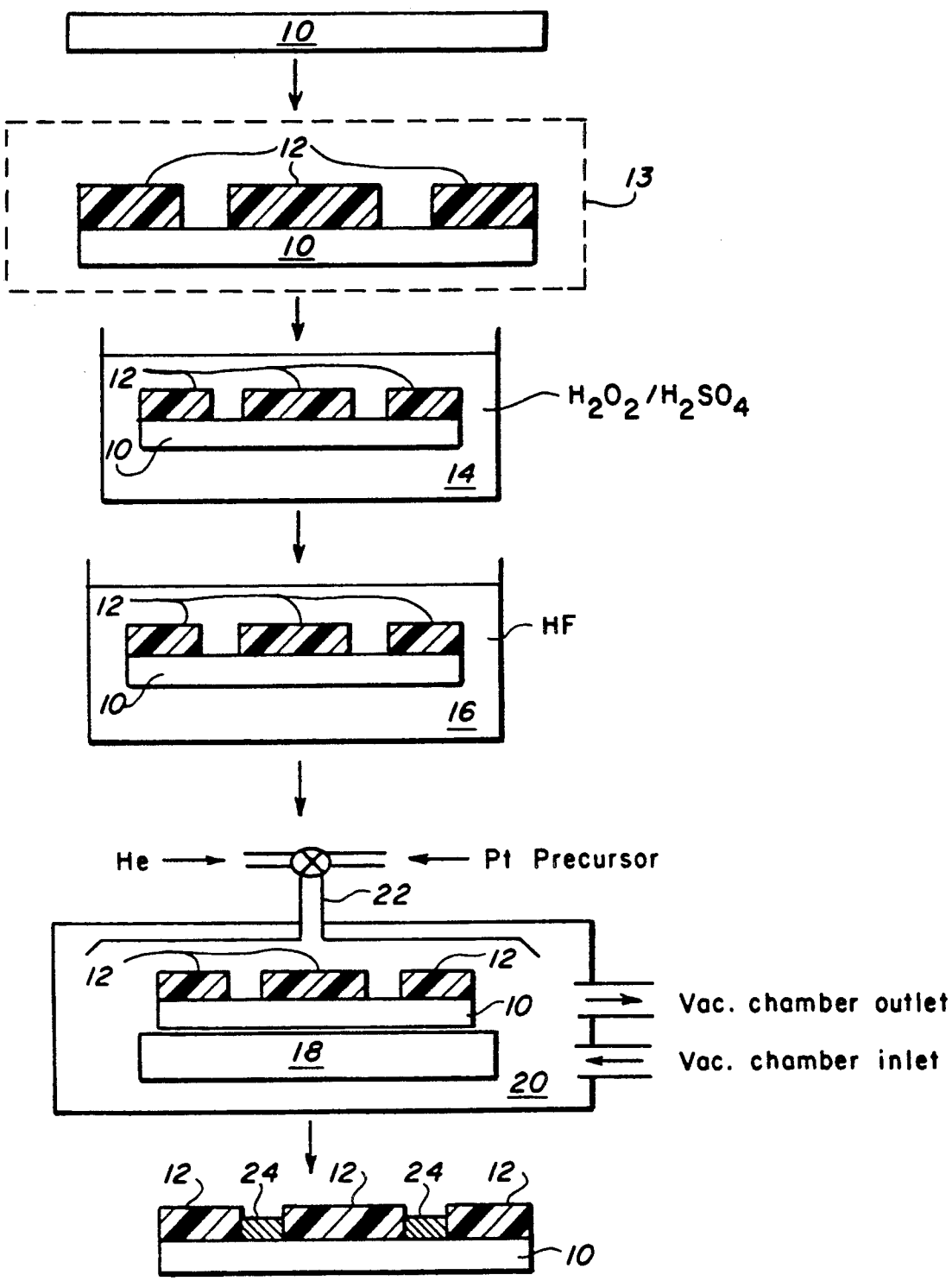
FIG. 1 shows the steps in a selective platinum metallization process.

As shown in FIG. 1, the first step to the process of the invention is to put down on a substrate 10 a polyimide pattern 12 by standard photolithographic and curing techniques. Substrates 10 which may be selectively metallized by this process include all of the known conductive and semiconductive substrates, including conductive metals, Si, GaAs, Ge, and diamond. Preferred polyimides for patterning include Hitachi PIQ-13, Ciba Geigy Probimide 285, and their equivalents.

The patterned substrate 13 is preferably treated with a mixture 14 of concentrated $H_2SO_4$ and $H_2O_2$. Preferably, the mixture 14 of concentrated $H_2SO_4$ and $H_2O_2$ has a volume ratio of between about 8:2::acid: peroxide and about 2:8::acid:peroxide (most preferably this ratio is about 1:1::acid:peroxide). Preferably, the $H_2O_2$ mixed with the acid is initially diluted in $H_2O$ to a ratio of about 7:3::$H_2O$:$H_2O_2$. Preferably, the patterned substrate 13 is immersed in this mixture 14 for between about 2 and about 10 minutes, then rinsed and dried. Without wishing to be bound by theory, it is suggested that treatment with the acid/peroxide mixture oxidizes the surface of the polyimide, thereby reducing the polyimide reactivity to the platinum precursor, greatly enhancing the selectivity of the platinum deposition.

Preferably, the patterned substrate 13 also is treated with a solution 16 of HF for between about 5 seconds and about 5 minutes, then rinsed and dried. Preferably, this HF solution 16 is between about 1.5 vol % and about 10 vol % HF in $H_2O$. HF treatment is carried out to remove native oxide from the substrate 10 surface. HF treatment preferably is done on Si and other substrates not attacked by HF.

Preferably, the patterned substrate 13 is placed in a vacuum chamber 20 fitted With a heater 18. The sample 13 is heated to an operating temperature and pumped down to a sub-atmospheric base pressure.

The selection of the operating temperature will depend on the substrate and the polyimide used. If deposition is attempted at too low a temperature, depending on the type of substrate used, no platinum will be deposited. For conductive substrates, it is preferred to select an operating temperature of at least about 150° C.; for semiconductive substrates, it is preferred to select an operating temperature of at least about 200° C.

If deposition is attempted at too high a temperature, depending on the type of polyimide used, the polyimide may be degraded, or the platinum film may be deposited on the polyimide as well on the exposed portion of the substrate. Hitachi PIQ-13 polyimide may be preferably used for selective metallization at temperatures up to about 270° C. Ciba Geigy Probimide 285 may be preferably used for selective metallization at temperatures up to about 300° C. Generally speaking, Hitachi PIQ-13 polyimide tends to provide superior selectivity according to this invention, compared to Ciba Geigy Probimide 285.

The selection of the operating pressure and temperature are limited by the goal of selectivity. Generally speaking, selectivity progressively degrades with increasing precursor pressure, operating temperature, and precursor treatment time. For instance, at or above about $10^{-3}$ torr, CVD platinum deposition is essentially nonselective for moderately high temperatures. Excessive precursor pressure will lead to excessive random precipitation of platinum, reducing selectivity. Consequently, it is preferred to keep the pressure of the precursor gas within the range of about $10^{-7}$ torr to about $10^{-3}$ torr. The base pressure should be below the combined pressure of the precursor and carrier gases, to permit these gases to flow into the vacuum chamber.

Skilled practitioners will recognize that problems with excessive chamber pressure may arise from several sources. Depending upon the precursor gas selected, excessive water vapor pressure may enhance the reactivity of the polyimide with the platinum precursor, reducing selectivity.

The platinum precursor gas is selected from the group of platinum-containing compounds that are at least partially volatile (having a measurable vapor pressure) at the operating temperature. Preferably, this platinum-containing compound is $Pt(PF_3)_4$. Preferably, the precursor gas is diluted by a factor of between about 5 and about 1000 (more preferably by a factor of between about 10 and about 20) with a carrier gas.

If a carrier gas is used, the carrier gas is preferably not significantly reactive with the platinum precursor gas, and is reducing or nonreactive with the substrate, the platinum film, and the polyimide. Preferred carrier gases include $H_2$, $N_2$, He, Ne, Ar, Kr, and Xe. Preferably, the precursor gas and any carrier gas are delivered at an operating pressure of between about $10^{-7}$ torr and about $10^{-3}$ torr, and at a total delivery rate of between about 1 standard cubic centimeter/minute (sccm) and about 3 sccm. Delivery is continued until the desired Pt thickness is achieved, typically about 3 minutes for a 10 nm thick Pt film.

After the platinum film is deposited, and the device is allowed to cool, the polyimide mask may be removed by washing with an appropriate solvent or by using an oxygen plasma, without harming the platinum pattern.

Having described the invention, the following examples are given to illustrate specific applications of the invention, including the best mode now known to perform the invention. These specific examples are not intended to limit the scope of the invention described in this application.

EXAMPLE 1

Preparation and Testing of a Platinum Pattern on a Silicon Substrate

A silicon substrate 10, measuring 10 mm × 10 mm, was patterned with a series of parallel, 2 mm wide polyimide stripes 12. These stripes 12 were separated by 2 mm of bare silicon. The polyimide used was Hitachi PIQ-13. This polyimide pattern was put down by standard lithographic and curing methods.

The patterned substrate 13 was cleaned by swirling in warm trichloroethylene and isopropyl alcohol, and then rinsed in triply distilled water. The sample was then dried in a stream of argon.

The sample 13 was immersed for 5 minutes in a solution of 50 vol % concentrated $H_2SO_4$, 50 vol % $H_2O_2$ ($H_2O_2$ was 7:3::water:$H_2O_2$). This treatment was followed by repeated ultrasonication in triply distilled water. After blow-drying in an argon stream, the sample was dipped into 10 vol % HF for 5 minutes, followed by another cycle of ultrasonication and blow-drying.

The sample 13 was mounted on a resistive heater 18 inside a vacuum chamber 20, which was then pumped down to a base pressure of about $10^{-7}$ torr. The sample 13 was then manipulated, via a translation stage in the vacuum chamber 20, to a position perpendicular to and several mm from a 12 mm diameter gas doser tube 22. The sample 13 was heated to a temperature of about 240° C. $Pt(PF_3)_4$ was diluted by a factor of about 20 in a 1:1::$H_2$: He carrier gas mixture, and delivered through the gas doser tube 22 at a rate of about 2 sccm and an operating pressure of about $10^{-5}$ torr. The gas was delivered for 3 minutes. The sample 13 was allowed to cool.

Figure 3:
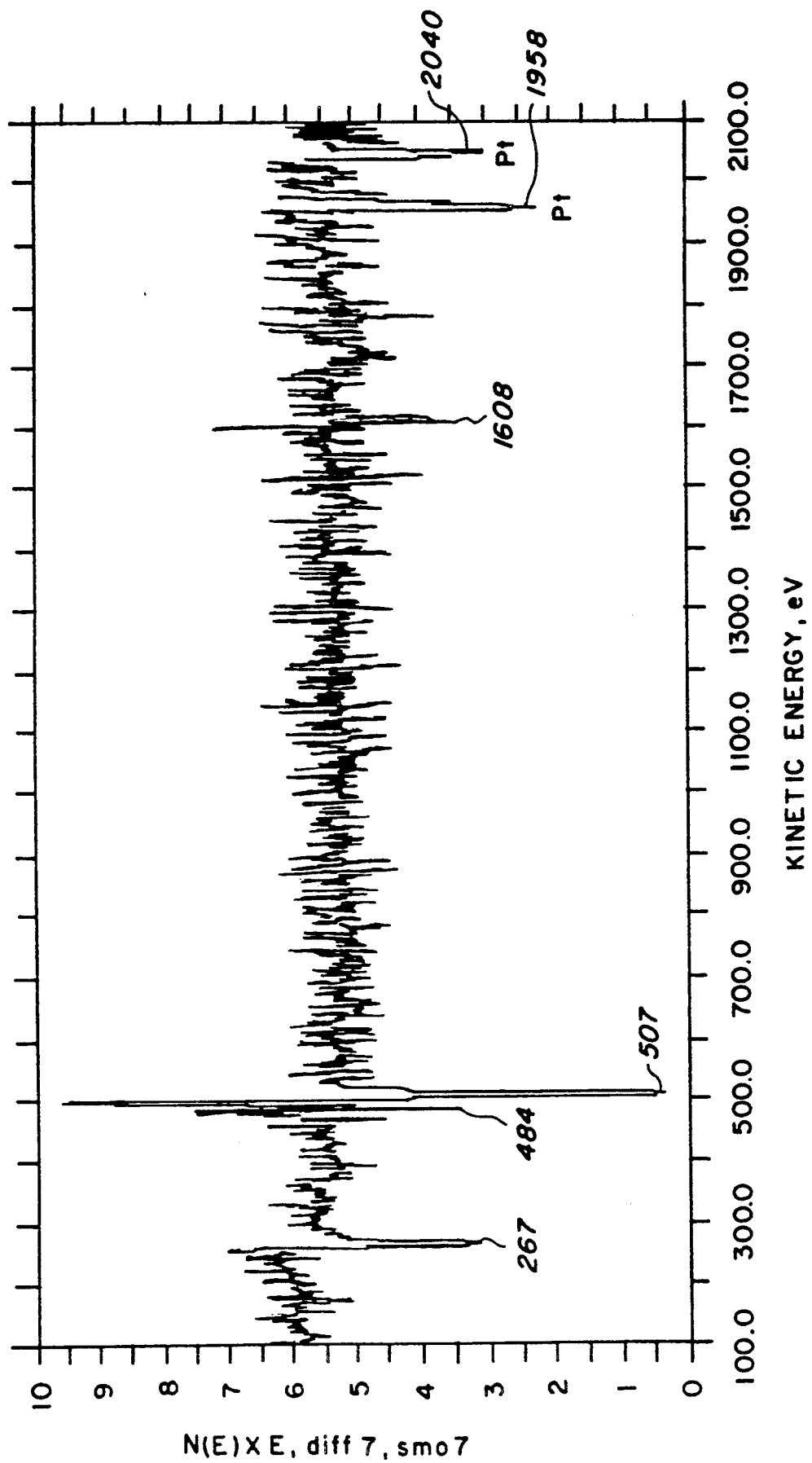
Figure 4:
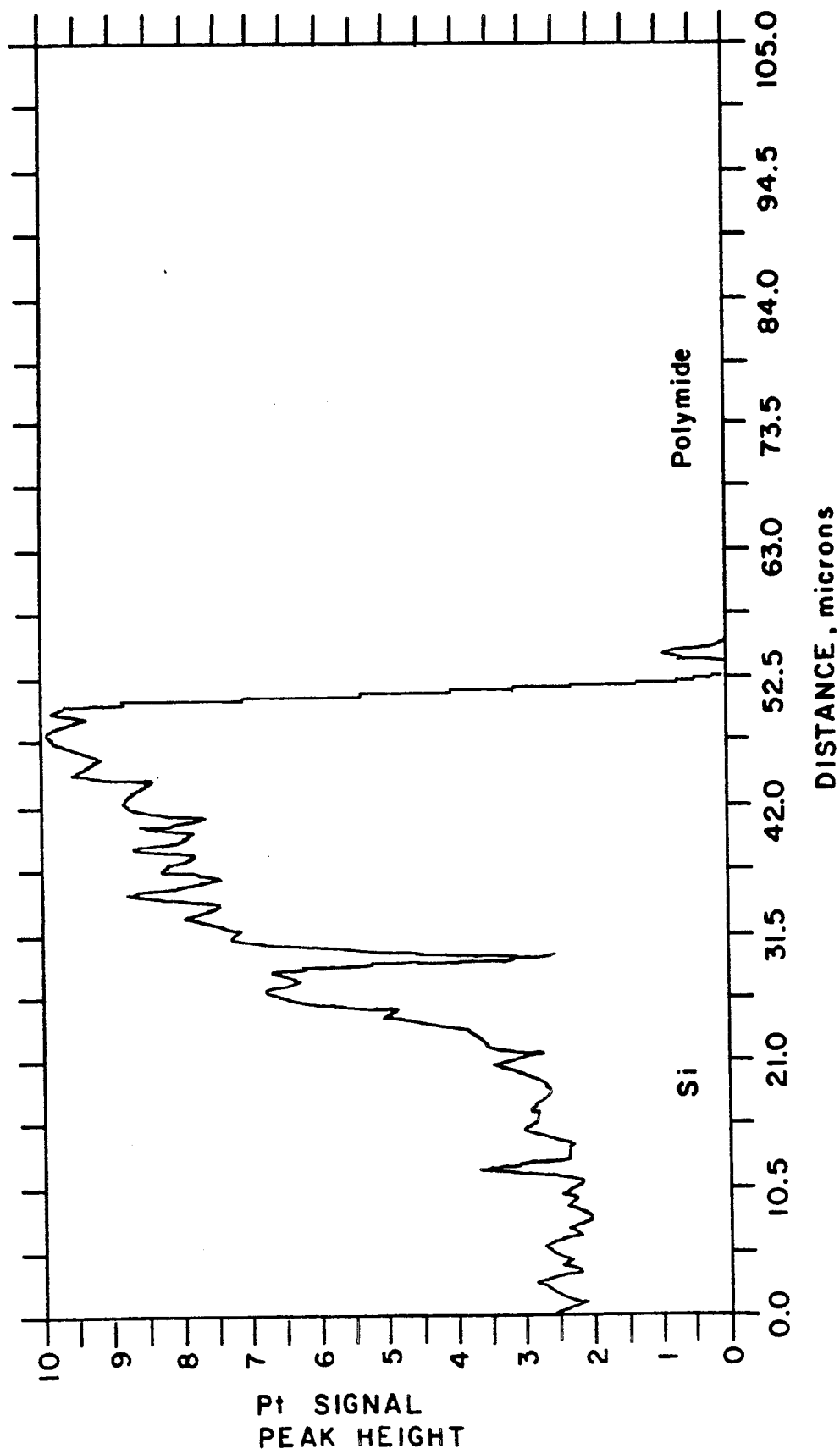

Visual inspection showed that the platinum metal 24 only adhered to the portions of the sample 13 that were not covered by the polyimide. The sample was analyzed by scanning auger microscopy (SAM). Results are shown in FIGS. 2, 3, and 4.

Figure 2:
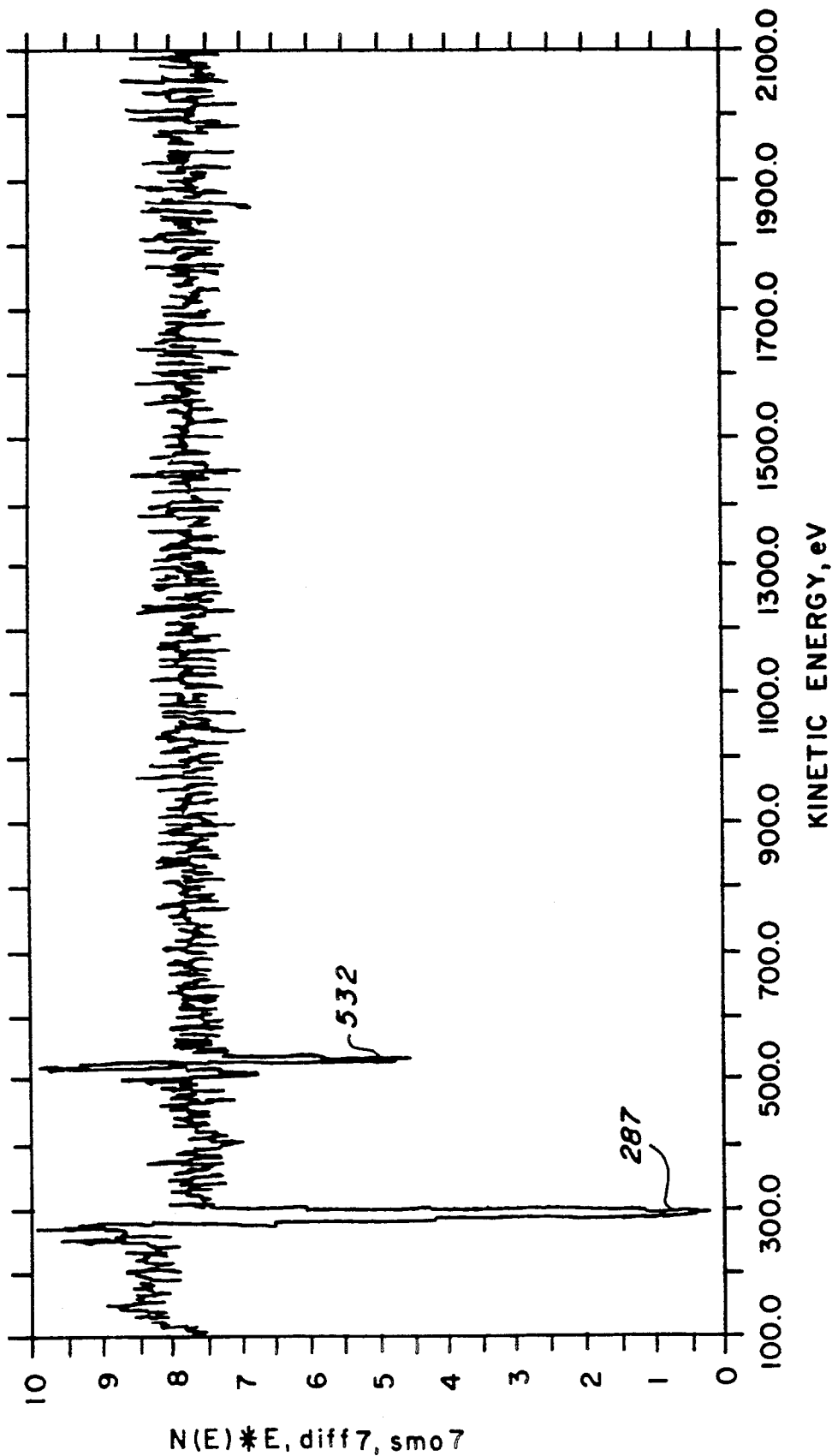
FIGS. 2, 3, and 4 show AES plots of a sample made according to the invention.

FIG. 2 shows the signal for varying energies at a point on the polyimide-covered portion of the substrate. This figure shows the absence of a Pt signal on the polyimide-covered portion of the substrate. FIG. 3 shows the signal for varying energies at a point on the metallized portion of the substrate. This figure shows the presence of a strong Pt signal on the exposed portion of the substrate. FIG. 4 shows the Pt signal for a scan from a metallized to a non-metallized portion of the substrate. This figure shows the complete dropoff of the Pt signal observed when scanning form the exposed portion of the substrate to the polyimide-covered portion of the substrate.

EXAMPLE 2

Preparation and Testing of a Platinum Pattern on a Silicon Substrate

Example 1 was repeated, with the following changes: (1) the trichloroethylene solvent cleaning step was omitted; (2) the sample temperature was 260° C. (3) the $Pt(PF_3)_4$ precursor was diluted by a factor of 6.7 in $H_2$ carrier gas (no He); (4) the operating pressure was $2 \times 10^{-5}$ torr; (5) the gas was delivered for 19 minutes.

Again, visual inspection showed that the platinum metal only adhered to the portions of the substrate that were not covered by the polyimide. The sample was analyzed by scanning auger microscopy. Results (from scans similar to those shown in FIGS. 2 and 3) showed the presence of Pt on the exposed portion of the substrate, and the absence of Pt on the polyimide-covered portion of the substrate.

Obviously, many modifications and variations of the present invention are possible in light of the above teachings. It is therefore to be understood that, within the scope of the appended claims, the invention may be practiced otherwise than as specifically described.

What is claimed is:

1. A process for selectively depositing platinum on a conductive or semiconductive substrate, comprising the steps of;

patterning a polyimide layer on said substrate, thereby patterning said substrate to have exposed areas and unexposed areas; and at an operating temperature and an operating pressure, flowing a platinum precursor gas over said substrate, wherein said platinum precursor gas comprises $Pt(PF_3)_4$, wherein said operating temperature is at least a temperature at which platinum deposition on said substrate is effected, wherein said operating temperature is less than a temperature at which either said polyimide degrades or said platinum fails to selectively deposit on said substrate, wherein said operating pressure is less than a pressure at which platinum will fail to selectively deposit on said substrate, thereby selectively depositing platinum on said exposed areas on said substrate.

2. The process of claim 1, further comprising contacting said patterned substrate with a mixture of strong acid and hydrogen peroxide before said step of flowing said platinum precursor gas over said substrate.

3. The process of claim 2, wherein said strong acid is $H_2SO_4$.

4. The process of claim 2, further comprising contacting said patterned substrate with HF before said step of flowing said platinum precursor gas over said substrate.

5. The process of claim 1, further comprising contacting said patterned substrate with HF before said step of flowing said platinum precursor gas over said substrate.

6. The process of claim 1, wherein said step of flowing said platinum precursor gas over said substrate further comprises diluting said platinum precursor gas in a carrier gas by a factor of between about 5 and about 1000, wherein said carrier gas is selected from the group of gases consisting of gases that are not significantly reactive with said platinum precursor gas and are reducing or nonreactive with said platinum film, said substrate and said polyimide.

7. The process of claim 6, wherein said carrier gas is selected from the group consisting of $H_2$, $N_2$, He, Ne, Ar, Kr, and Xe.

8. The process of claim 1, wherein said substrate is selected from the group consisting of conductive metals, and wherein said operating temperature is between about 150° C. and about 300° C.

9. The process of claim 1, wherein said substrate is selected from the group consisting of semiconductive substrates, and wherein said operating temperature is between about 200° C. and about 300° C.

10. The process of claim 9, wherein said semiconductive substrate is selected from the group consisting of Si, GaAs, Ge, and diamond.

11. A process for selectively depositing platinum on a conductive or semiconductive substrate, comprising the steps of;

patterning a polyimide layer on said substrate, thereby patterning said substrate to have exposed areas and unexposed areas;

treating said patterned substrate by contacting said patterned substrate with a mixture of $H_2SO_4$ and $H_2O_2$;

treating said patterned substrate by contacting said patterned substrate with HF;

bringing said patterned and treated substrate to a temperature between about 150° C. and about 300° C;

placing said patterned substrate in a vacuum chamber, and reducing the base pressure about said patterned substrate to between about $10^{-8}$ torr and about $10^{-2}$ torr; contacting said substrate with a flow of platinum precursor gas and carrier gas, wherein said platinum precursor gas comprises $Pt(PF_3)_4$ and wherein said carrier gas comprises a gas selected from the group consisting of $H_2$, $N_2$, He, Ne, Ar, Kr, and Xe.

* * * * *